(12) United States Patent
Anderson et al.

(10) Patent No.: US 9,837,143 B1
(45) Date of Patent: Dec. 5, 2017

(54) NAND-BASED WRITE DRIVER FOR SRAM

(71) Applicant: International Business Machines Corporation, Armonk, NY (US)

(72) Inventors: Hans-Werner Anderson, Filderstadt (DE); Thomas Kalla, Boeblingen (DE); Jens Noack, Stuttgart (DE); Holger Wetter, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/291,391

(22) Filed: Oct. 12, 2016

(51) Int. Cl.
*G11C 11/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
USPC ........................................................ 365/154
See application file for complete search history.

(56) References Cited

U.S. PATENT DOCUMENTS

| | | | |
|---|---|---|---|
| 8,824,230 B2 | 9/2014 | Phan et al. | |
| 9,336,863 B2 | 5/2016 | Jung et al. | |
| 2004/0017709 A1* | 1/2004 | Braceras | G11C 29/025 365/201 |
| 2011/0149667 A1* | 6/2011 | Hamzaoglu | G11C 11/413 365/203 |
| 2016/0086659 A1 | 3/2016 | Kugel et al. | |

OTHER PUBLICATIONS

Hattori et al.; "90% Write Power Saving SRAM Using Sense-Amplifying Memory Cell"; 2002 Symposium on VLSI Circuits Digest of Technical Papers; 2002; pp. 46-47.
Kanda et al.; "90% Write Power Saving SRAM Using Sense-Amplifying Memory Cell"; IEEE Journal of Solid-State Circuits, vol. 39, No. 6, Jun. 2004; 7 pages.

* cited by examiner

*Primary Examiner* — Tha-O H Bui
(74) *Attorney, Agent, or Firm* — Brian M. Restauro; A. Imtiaz Billah

(57) ABSTRACT

Embodiments of the present invention provide systems and methods for reducing power consumption during the operation of a SRAM cell. Embodiments of the present invention reduce power consumption by determining switching activity, and based off a determination of low switching activity, gates off a core which is not written; and limits switching activity on the unaddressed core by applying the highest order bit.

6 Claims, 8 Drawing Sheets

| INPUTTED DATA (Switching Factor %) | 0% Switching | 50% Switching | 100% Switching |
|---|---|---|---|
| I - ORIGINAL DESIGN (NON-GATED) | 7.70 mA | 47.00 mA | 85.00 mA |
| II - MSB Switching after each cycle (GATED) | 48.14 mA | 55.58 mA | 63.87 mA |
| III - MSB Switching every second cycle (GATED) | 27.46 mA | 42.07 mA | 55.88 mA |
| IV - MSB Switching every fourth cycle (GATED) | 15.57 mA | 34.02 mA | 52.47 mA |
| V - MSB Switching every eighth cycle (GATED) | 11.46 mA | 31.65 mA | 51.10 mA |
| VI - MSB Does NOT Switch (GATED) | 7.65 mA | 29.36 mA | 50.45 mA |

FIG. 5

NAND-BASED WRITE DRIVER FOR SRAM

BACKGROUND OF THE INVENTION

The present invention relates generally to array circuit designs, and more specifically to reduce power consumption during computer data storage.

Static Random Access Memory (SRAM) is a type of computer data storage which does not require frequent refreshing. Furthermore, the data/information from one zone within the computer memory does not need to be read and rewritten to the same zone every so often, and thus described in the art as "static." SRAM is used for a CPU cache. SRAM is volatile in the conventional sense in that data is eventually lost when the memory is not powered while exhibiting data remanence, (i.e., the residual representation of digital data that remains after attempts have been made to remove or erase the data). By applying bi-stable latching circuitry, SRAM stores bits (i.e., a basic unit of information in computing) as data storage elements. A latch or a flip-flop of the SRAM (which is a circuit by design) stores state information on each bit. The binary nature of these bits is represented in terms of two states—"zero" or "one." In other words, each bit is in the "zero" state or the "one" state.

SUMMARY

According to one embodiment of the present invention, a system for reducing power consumption during the operation of SRAM is provided. The system comprises: a first system for reducing power consumption during the operation of SRAM, comprising: a plurality of array cores, wherein each array core of the plurality of array cores contain SRAM cells; a decoding device, wherein the decoding device is configured to process a plurality bits; and a write head circuit, wherein the write head circuit comprises: two NAND units, wherein each of the two NAND units are operatively coupled directly to respective array cores of the plurality of array cores and are configured to gate off a write bit line based, at least in part, on identified switching activity, and an inverter unit that is connected between the two NAND units.

Another embodiment of the present invention provides another system for reducing power consumption during the operation of SRAM.

Another embodiment of the present invention provides a method for reducing power consumption during the operation of SRAM, based on the systems described above.

BRIEF DESCRIPTION OF THE DRAWINGS

FIG. 5 is a table summarizing the power consumed by a non-gated system and gated systems with respect to switching activity, in accordance with an embodiment of the present invention.

DETAILED DESCRIPTION

Figure 1A:
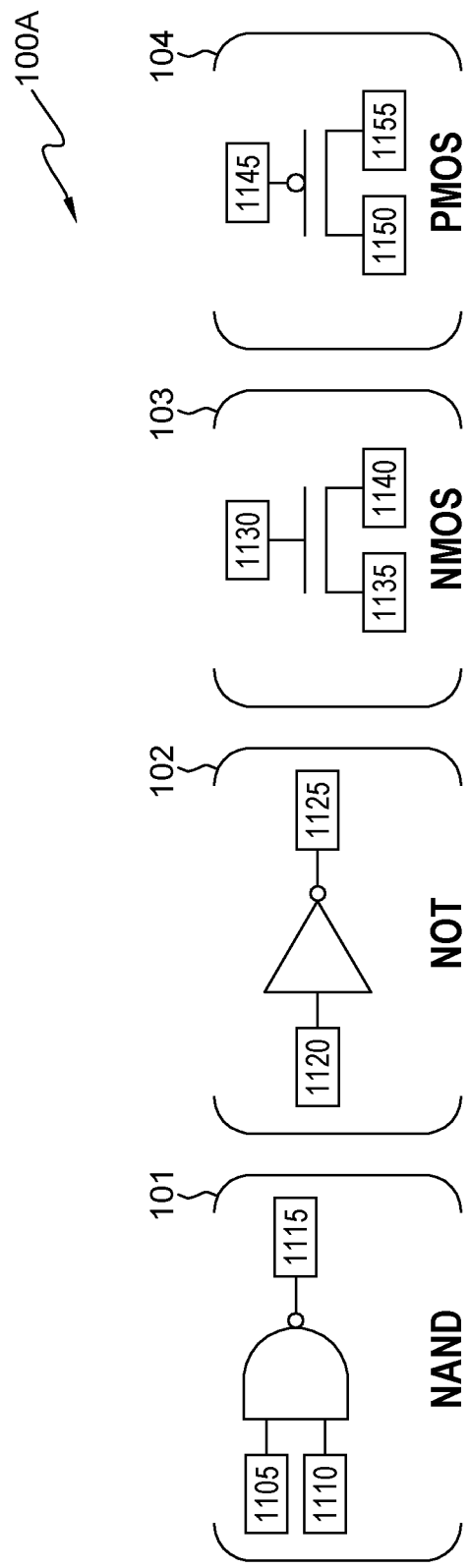
FIG. 1A is a block diagram of a computing environment, in accordance with an embodiment of the present invention.

In contrast to SRAM, dynamic random access memory (DRAM) requires more frequent refreshing than SRAM and DRAM is used for a computer's main memory as opposed to the CPU cache. In some instances, SRAM consumes less power than DRAM due to less frequent refreshing by SRAM in comparison to DRAM. In other instances, SRAM consumes as much energy as DRAM due to increased frequent refreshing by SRAM. SRAM is found in many devices including personal computers, work stations, hard disk buffers, liquid display crystal screens, automotive electronics, etc. Furthermore, there are different variants of SRAM including: non-volatile SRAMs; synchronous SRAMs; asynchronous SRAMs; metal oxide semiconductor field effect transistor (MOSFET) type SRAMs; and bipolar junction transistor type SRAMs. (This is not an exhaustive list and the invention is not limited to only these variants of SRAM.)

In one embodiment, SRAM is split into multiple cores containing one or more arrays. An array is a data structure which is composed of a collection of elements (e.g., values or variables), wherein each element is identified by at least one array index or key. For example, there is an array with 256 elements which has a left array core with 128 elements and a right array core with 128 elements. SRAMs are available for the operations of reading and writing data. Write-data is the term used to refer to data on which write operations are being performed on. For an array configured as 1 Write operation/1 Read operation, only a single write port can be written at a given time. Furthermore, at any given time, the write port that can be written is either the left array core or the right array core. Despite that either the left array core or the right array core can be written at the given time, some of the write-data is driven into the left array core and the right array core in parallel and thus, leading to at least the undesired effects of: (i) unwanted power consumption by SRAM; and (ii) extra switching activity in the unaddressed core. In turn, this extra switching activity in the non-addressed core leads to a poorer performance of SRAM and even more unwanted power consumption by SRAM. In order to alleviate the undesired effects as described above, embodiments of this invention disclose solutions to perform at least the following functions: (i) gating off a core which is not written; (ii) limiting or suppressing all switching activity on the unaddressed core; (iii) applying the highest order bit (i.e., also referred to as the most significant bit, (MSB)) of the write-address, wherein the MSB is indicative of which core is written; (iv) gating off a core by composing the write-data with the MSB of the write-address via a NAND-gate; (v) outputting of the NAND as logic data 1, independent of any switching activity on the write-data input of the NAND; (vi) limiting switching activity of the MSB of the write-address in order to maximize power saving; (vii) utilizing a designed compiler, which controls and limits the switching activity of the MSB of the write address, in order to maximize power savings; and (viii) upon determining there is high switching activity on the MSB of the write-address, disabling the gating by another control switch.

The present invention will now be described in detail with reference to the Figures. FIG. 1A is a block diagram of computing environment 100A, in accordance with an embodiment of the present invention. FIG. 1A provides only an illustration of implementation of electronic component devices used in a computing environment and does not imply any limitations with regard to the environments in which different embodiments may be implemented.

Computing environment 100A depict block diagrams of electronic components devices necessary to implement the methods and systems as disclosed by the embodiments of the present invention. Additional types of electronic component devices may be used without departing from the scope of the invention as recited by the claims. The electronic components, depicted in FIG. 1A, are arranged in particular configurations in conjunction with other wires, voltage sources, data sources, etc., in order to enable the process of gating off an array core during a write operation. The details pertaining to the configured arrangements of these electronic components will be discussed in more detail with respect to FIG. 2, FIG. 3A, and FIG. 3B. Computing environment 100A depicts the following electronic components: NAND 101; NOT 102; n-channel metal oxide semiconductor 103 (NMOS 103); and p-channel metal oxide semiconductor 104 (PMOS 104).

NAND 101 is a digital logic gate, which contains three terminals—1105, 1110, and 1115. NAND 101 is depicted using the MIL/ANSI symbol convention, wherein MIL/ANSI is a set of voluntary standards for products, services, processes, systems, and personnel in the United States. These terminals may be connected to data inputs, other wires, other electronic components, and/or other devices. The output to terminal 1115 is based on the input from terminal 1105 and the input from terminal 1110. In instances where the input to the gate from terminal 1105 is HIGH (i.e., logic data 1) and the input to the gate at 1110 is HIGH (i.e., logic data 1), then the output at 1115 is LOW (i.e., logic data 0). In instances where the input to the gate at 1105 and 1110 are both LOW (i.e., logic data 0) or the input to 1105 is only LOW (i.e., logic data 0) or the input to 1110 is only LOW (i.e., logic data 0), then the output at 1115 is HIGH (i.e., logic data 1). The resulting output of NAND 101 is rationalized by the notion of a complement, as defined by set theory, on the truth functional operator of logical conjunction. Transistors and junction diodes are used to make NAND 101.

NOT 102 is a digital logic gate, which contains two terminals—1120 and 1125. NOT 102 is also referred to as an inverter. NOT 102 is depicted using the MIL/ANSI symbol convention, wherein MIL/ANSI is a set of voluntary standards for products, services, processes, systems, and personnel in the United States. These terminals may be connected to data inputs, other wires, other electronic components, and/or devices. The output to terminal 1125 is based on the input from terminal 1120. If the input to the gate from terminal 1120 is HIGH (i.e., logic data 1), then the output at 1125 is LOW (i.e., logic data 0). If the input to the gate at 1120 is LOW (i.e., logic data 0), then the output at 1125 is HIGH (i.e., logic data 0). The resulting output of NOT 102 is rationalized by the notion of logical negation of the input. Complimentary metal-oxide semiconductor field-effect transistors (CMOS); resistors; and/or bipolar junction transistors in resistor-transistor logic configuration or transistor-logic configuration are used to make NOT 102.

NMOS 103 is a type of metal-oxide semiconductor field-effect transistor (MOSFET) used for amplifying and switch electronic signals. More specifically, NMOS 103 is a n-channel MOSFET and thus uses electrons (as opposed to holes) for conduction. NMOS 103 is a device containing three terminals—1130, 1135, and 1140. These terminals may be connected to data inputs, other wires, other electronic components, and/or devices. Terminal 1130 is the ground terminal; terminal 1135 is the source terminal; and terminal 1140 is the drain terminal. Drain-to-source current flows (via a conducting channel) connects the source terminal (i.e., terminal 1135) to the drain terminal (i.e., terminal 1140). The conductivity is varied by the electric field that is produced when a voltage is applied between the gate terminal (i.e., terminal 1130) and the source terminal (i.e., terminal 1135). Hence, the current flowing between 1140 and 1135 is controlled by the voltage applied between terminal 1130 and terminal 1135. Terminal 1130 is attached to a polysilicon surface. Terminals 1135 and 1140 are connected to a silicon oxide surface using heavily doped n-type material (i.e., electrons/electron rich carriers to facilitate conduction). Electric current flows from terminal 1130 and 1140 into terminal 1135 in the setup of NMOS 103. In other words, electric currents leave the gate terminal and the drain terminal and arrive into the source terminal.

PMOS 104 is a type of metal-oxide semiconductor field-effect transistor (MOSFET) used for amplifying and switch electronic signals. More specifically, PMOS 104 is a p-channel MOSFET and thus uses holes (as opposed to electrons) for conduction. PMOS 104 is a device containing three terminals—1145, 1150, and 1155. These terminals may be connected to data inputs, other wires, other electronic components, and/or devices. In this embodiment, the gate terminal is terminal 1145; the source terminal is terminal 1155; and the drain terminal is terminal 1150. Drain-to-source current flows (via a conducting channel) connects the source terminal (i.e., terminal 1155) to the drain terminal (i.e., terminal 1150). The conductivity is varied by the electric field that is produced when a voltage is applied between the gate terminal (i.e., terminal 1145) and the drain terminal (i.e., terminal 1150). Hence, the current flowing between 1155 and 1150 is controlled by the voltage applied between terminal 1145 and terminal 1150. Terminal 1145 is attached to a polysilicon surface. Terminals 1155 and 1150 are connected to a silicon oxide surface using heavily doped p-type material (i.e., holes/electron deficient carriers to facilitate conduction). Electric current flows from terminals 1155 and 1150 into terminal 1145 in the setup of PMOS 104. In other words, electric currents leave the source terminal and gate terminal and arrive into the drain terminal.

Figure 1B:
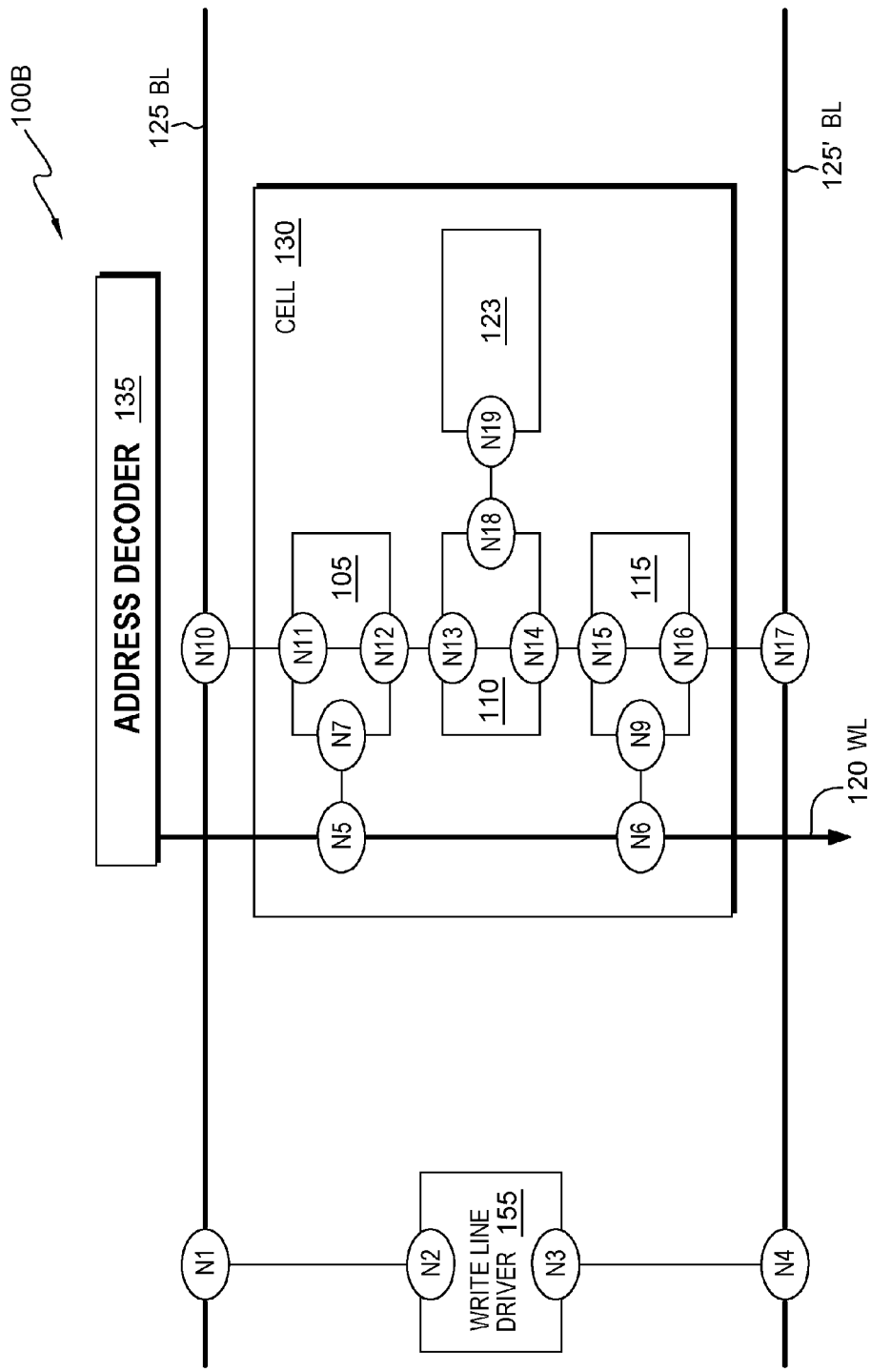
FIG. 1B is a functional block diagram of SRAM architecture in terms of electronic components devices, in accordance with an embodiment of the present invention.

FIG. 1B is a functional block diagram of SRAM architecture in terms of electronic components devices, in accordance with an embodiment of the present invention. FIG. 1B provides only an illustration of implementation and does not imply any limitations with regard to the environments in which different embodiments may be implemented.

Modifications to computing environment 100B may be made by those skilled in the art without departing from the scope of the invention as recited by the claims. Computing environment 100B, may be, for example, SRAM architecture of one or more component devices of FIG. 1A. Computing environment 100B includes a memory cell (e.g., cell 130) attached to external devices (i.e., write line driver 155 and address decoder 135) through internal circuitry (i.e., the bit line pair—BL 125/BL 125'- and a word lines—WL 120).

Wires are utilized to connect the components within computing environment 100B; transfer data; conduct electrical current; and perform other functions. Not all of the wires are illustrated. Read word lines and read bit lines are not depicted however this does not exclude SRAM systems which contain read word lines and read bit lines from the scope of the invention as recited by the claims. Nodes N1 to N7, and N9 to N19 are points of connection of one component to another component via a wire. Write line driver 155 is connected to BL 125 and BL 125' as depicted by a wire connecting nodes N1 and N2; and nodes N3 and N4, respectively. Access transistor 105 is connected to BL 125; bi-stable flip-flop 110; and WL 120 as depicted by a wire connecting nodes N10 and N11; nodes N12 and N13; and nodes N5, N6, and N7, respectively. Bi-stable flip-flop 110 is an actual structure which stores a bit, wherein the bit is either in the state of logic data 0 or logic data 1 and is connected to access transistor 105; access transistor 115; read port 123 as depicted by a wire connecting nodes N12 and N13; nodes N14 and N15; and nodes N18 and N19, respectively. Access transistor 115 is connected to BL 125'; bi-stable flip-flop 110; and WL 120 as depicted by a wire connecting nodes N16 and N17; nodes N14 and N15; and nodes N6 and N9, respectively.

Cell 130 may be referred to as a bit cell or memory cell. In this embodiment, cell 130 is an 8 Transistor SRAM (8T-SRAM) cell. Furthermore, cell 130 may be a dual port 8T-SRAM cell or a stack 8T-SRAM cell or any other standard 8T-SRAM cell. Cell 130 contains/employs at least the following structures: (i) access transistor 105; (ii) bi-stable flip-flop 110; (iii) access transistor 115; and (iv) read port 123. Within an array (or array core), there are multiple units of cell 130 which are arranged in a two-dimensional manner (as will be discussed with respect to FIG. 1C). In other embodiments, access transistor 105, bi-stable flip-flop 110, and access transistor 110, arranged as described with respect to FIG. 1B, is a 6-Transistor SRAM cell. Read port 123 may contain a ground voltage device (Vss) and two NMOS transistors similar to NMOS 103. The ground voltage device and the NMOS transistors can be arranged in more than one way. In one arrangement of read port 123, cell 130 is a dual port 8T-SRAM cell while in another arrangement, cell 130 is a stack 8T-SRAM cell. A single bit is stored for each unit of cell 130.

Access transistor 105 and access transistor 115 are used as intermediaries to connect bi-stable flip-flop 110 to the bit line pair of BL 125/BL 125' and WL 120. Access transistor 105 and access transistor 110 are each a NMOS type transistor that is structurally similar to NMOS 103 of FIG. 1A. The gate terminal and the drain terminal, as contained within access transistor 105 and access transistor 110, are used to connect to word lines (i.e., WL 120), and bit line pair (i.e., BL 125/BL 125'), respectively. In turn, WL 120 is used to select a single unit of cell 130 among multiple units of cell 130; and BL 125/BL 125' is used to perform read and write operations on cell 130. Herein, the "one" state will be referred to as "logic data 1" and the "zero" state will be referred to as "logic data 0" and the "one" state will be referred to as "logic data 1."

Bi-stable flip-flop 110 is an actual structure which stores a bit, wherein the bit is either in the state of logic data 0 or logic data 1. Logic data 0 and logic data 1 are complements of each other. Bi-stable flip-flop 110 contains two NMOS and two PMOS transistors which are similar to NMOS 103 and PMOS 104, respectively. These four transistors are arranged to make a complementary metal oxide semiconductor (CMOS) system (i.e., a circuit design using complementary and symmetrical pairs of NMOS and PMOS type transistors), which invokes two nodes in order to store a bit in a complementary fashion. If the bit is in the state of logic data 0, then the bit is stored in a first node and if the bit is in the state of logic 1, then the bit is stored in a second node. Furthermore, BL 125 and BL 125' are complements of each other, which means BL 125 and BL 125' work and are found in tandem. By virtue of exhibiting complementary behavior, BL 125 and BL 125' aid in transferring bits, which are units of data that exhibit complementary behavior.

Address decoder 135 is used to activate a word line. Only a single unit of WL 120 is depicted in FIG. 1B. However, there may be multiple units of WL 120. Address decoder 135 selects words, wherein these words are constructed by multiple address bits. These address bits are bits in that each address bit has state of logic data 0 or logic data 1. The total number of words which can be constructed by m address bits is $2^m$ words. Depending on the type of address decoder 135, the total number of words, as selected by address decoder 135, varies. For example, a 2:4-type address decoder 135 selects four words while a 3:8-type address decoder 135 selects eight words. Upon selecting a total number of words, address decoder 135 selects a single word among the total number of words to be selected for a data write or data read operation.

Read operations are performed by read port 123. Voltage sources are not explicitly shown in FIG. 1B. For purposes of this disclosure, read operations and voltage sources are not relevant for understanding the function of gating off cores during a write operation.

Write line driver 155 is a data write circuit comprising of inverters, transistors, and NANDs. A write enabling signal writes a bit (or data) and the complement bit (or complement data) onto BL 125 and BL 125'. Write line driver 155 writes a single bit onto one node and the complement bit of the single bit onto another node of the CMOS system in bi-stable flip-flop 110 of the selected bit through access transistor 105 and access transistor 115 of cell 130. In this embodiment, for every column within an array, a single unit of write line driver 155 is used. In instances where there is an array with two cores, the highest order bit, i.e., the most significant bit (MSB), of the written address bit indicates which one of the two cores is written. (The highest order bit is also referred to as the most significant bit.) The MSB of the written address bit is hence used to gate off the write bit lines of the core which is not being accessed. By applying NAND, write line driver 155 composes the write-data with the highest order bit (MSB) of the write-address in order to gate off the write bit line into one array core. When one core is not accessed, the output of the NAND is logic data 1, independent of any switching on the write-data input of the NAND. Where there is high amount of switching activity on the MSB of the write-address, there is potential for write line driver 155 to promote additional power dissipation even when the write-data is not switching. To account for this type of scenario, the gating can be disabled by another control-signal. Signals processed by write line driver 155 and other components of computing environment 100B are non-transitory in nature.

Figure 1C:
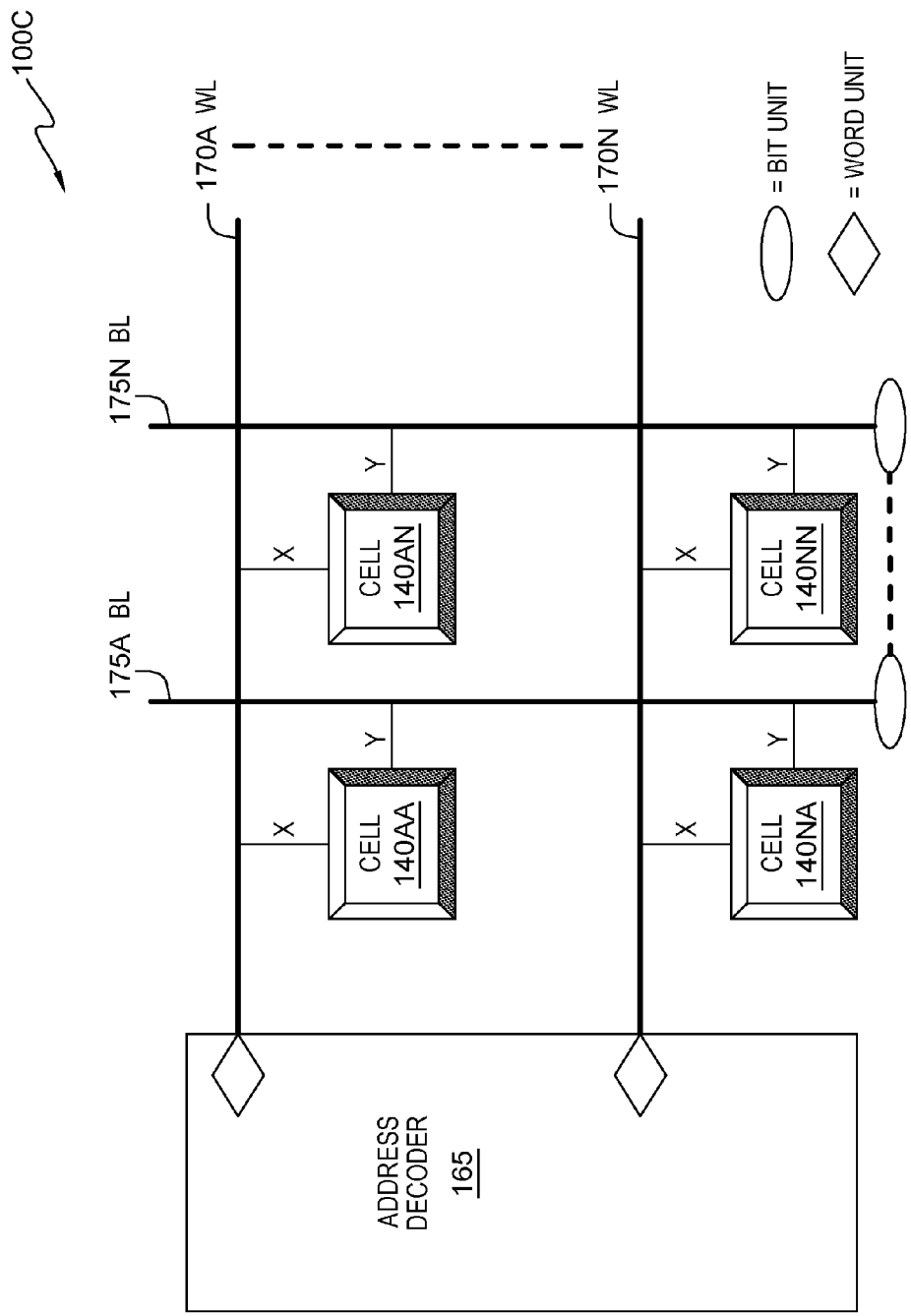
FIG. 1C is a functional block diagram of the array portion of SRAM architecture, in accordance with an embodiment of the present invention.

FIG. 1C is a functional block diagram of the array portion of SRAM architecture, in accordance with an embodiment of the present invention.

Computing environment 100C contains: (i) address decoder 165; (ii) word lines (WL 170A-N); (iii) bit lines (BL 175A-N); and memory cells (cells 140AA-AN, 140NA-140NN). WL 170A-N are similar to WL 120A of FIG. 1B. BL 175A-N are similar to bit line pair BL 125/BL 125' in FIG. 1B. Address decoder 165 is similar to address decoder 135 of FIG. 1B. Cells 140NA-AN, 140NA-140NN are similar to cell 130 of FIG. 1B.

The term "cell 140AA-NA, 140NA-NN" indicates there are multiple units of memory cells. The term "cell 140" is used to refer to a single unit of cell 140AA-NA, 140NA-NN.

The term "WL 170A-N" indicates there are multiple units of word lines. The term "WL 170" is used to refer to a single unit among WL 170A-N. WL 170A-N intersect at address decoder 165. Word units are transferred to cell 140 using WL 170, wherein a word unit is represented by the symbol—◇. WL 170 is associated with a row address or an X-coordinate.

The term "BL 175A-N" indicates there are multiple units of bit lines, the term "BL 175" is used to refer to a single unit among BL 175A-N. Bit units are transferred to cell 140 through BL 175, wherein a bit unit is represented by the symbol—○. BL 175 is associated with a column address or a Y-coordinate.

Cell 140AA, cell 140AN, cell NA, and cell NN have different addresses in terms of X-Y coordinates. The "AA", "AN", "NA", and "NN" notations are used to indicate which word line connects to a memory cell and which bit line connects to a memory cell. Cell 140AA connects to: (i) WL170A (and thus the X-coordinate is A); and (ii) BL 175A (and thus the Y-coordinate is A). Cell 140AN connects to: (i) WL170A (and thus the X-coordinate is A); and (ii) BL 175N (and thus the Y-coordinate is N). Cell 140NA connects to: (i) WL170N (and thus the X-coordinate is N); and (ii) BL 175A (and thus the Y-coordinate is A). Cell 140NN connects to: (i) WL170N (and thus the X-coordinate is N); and (ii) BL 175N (and thus the Y-coordinate is N).

Thus, the array in computing environment 100C comprises: cell 140AA, cell 140AN, cell NA, and cell NN. The array in computing environment 100C is a two-dimensional array containing a number of rows and a number of columns. For example, a 2×3 array indicates there a 2 row and 3 columns. The product of the number of rows in the array and the number of columns in the array equals the total number of bits contained within the array. The number of rows and the number of columns correspond directly to the number of WL 170 units and BL 175 units, respectively. For example, a system contains: (i) WL 170A, WL 170B, and WL 170C; and (ii) BL 175A, BL 175B, and BL 175C. Thus, there are three WL 170 units (which are the rows) and three BL 175 units (which are the columns) to furnish a 3×3 array containing 9 total bits.

Figure 2:
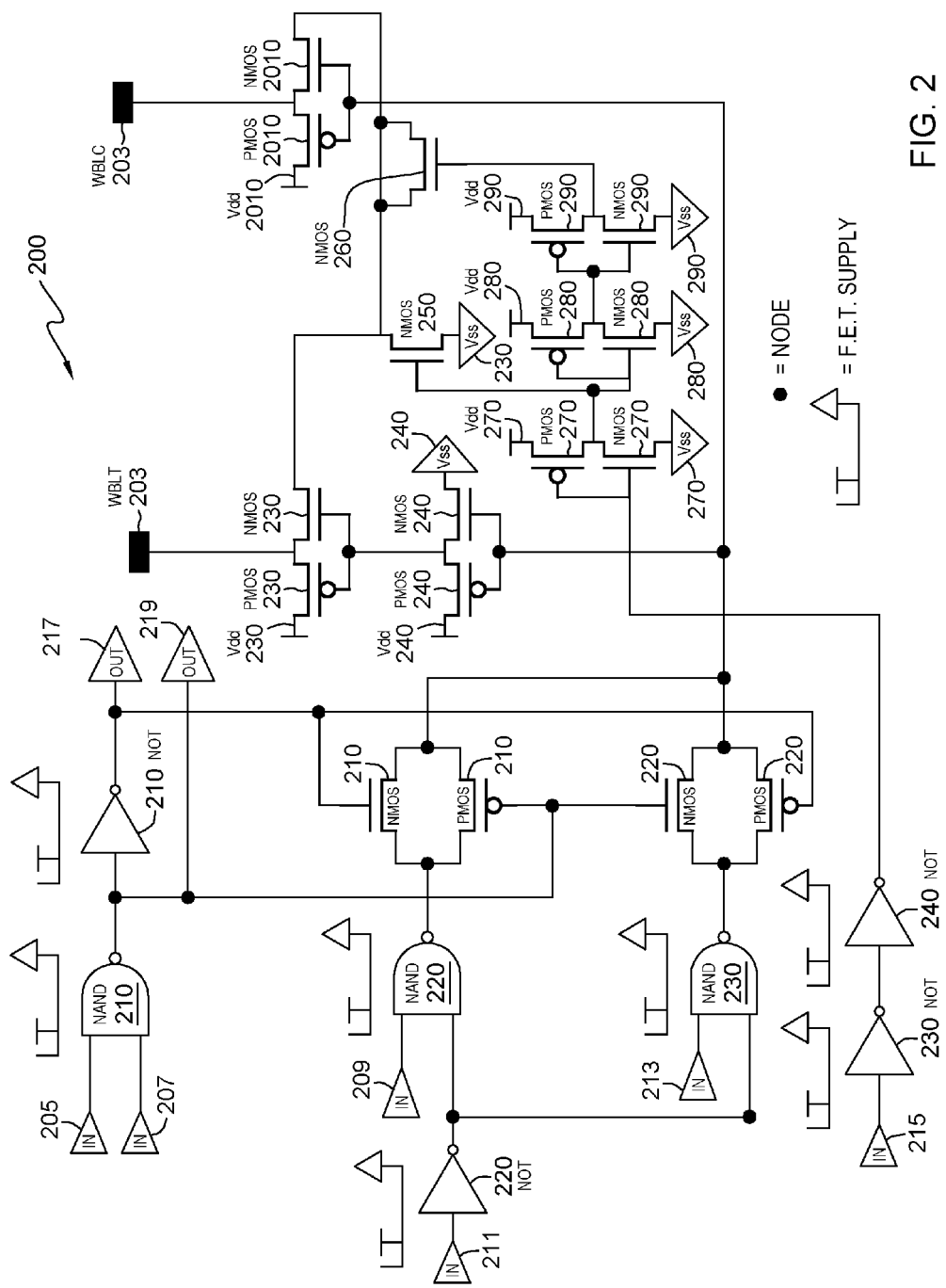
FIG. 2 is a schematic diagram of a circuit designed to enable the gating of an array core during a write operation, in accordance with an embodiment of the present invention.

FIG. 2 is a schematic diagram of a circuit designed to enable the gating of an array core during a write operation, in accordance with an embodiment of the present invention.

Write head circuit 200 is a schematic diagram of the circuitry as enabled by write line driver 155 of FIG. 1B. As opposed to a circuit using two inverters (such as those similar to NOR 102) to buffer data and enter data into the array cores, NAND devices (such as those similar to NAND 101) in write head circuit 200 are used to buffer data and enter data into the array core. Write head circuit 200 may contain wires and processors which are not explicitly depicted in FIG. 2, however may be added without departing from the scope of the claims, as recited.

The elements of the circuit diagram are described in terms of a component/device and an accompanying number, wherein the accompanying number is used to differentiate multiple units of the same component. For example, PMOS 240 is not the same as NMOS 240 in that "PMOS" (or a p-channel metal oxide semiconductor) is a different type of component/device than "NMOS" (or an n-channel metal oxide semiconductor). In contrast, NMOS 240 and NMOS 250 are the same type of component—a "NMOS" (or an n-channel metal oxide semiconductor) and the numbers "240" and "250" differentiate multiple units of the "NMOS."

Within a large SRAM array which is split into multiple array cores, write head circuit 200 performs the following functions: (i) accessing only a single array core at a given time; (ii) suppressing switching activity by gating off write bit lines of the un-accessed array core; and (iii) preventing write-data from being driven to all of the array cores in parallel by gating off write bit lines of the un-accessed array core. Furthermore, write head circuit 200 comprises: (i) a bit line driver region; (ii) a negative bit line region; (iii) a clock-gating region; (iv) a region for decoding signals (which are either transitory or non-transitory signals); (v) a region for propagating signals to the bit lines; and (vi) a region for buffering in data and implementing the gating mechanism.

Within write head circuit 200 contains a region which is a bit line driver associated with write bit lines. WBLT 203 and WBLC 203 are write bit lines which are complements of each other. The bit line driver transfers bits within SRAM. The CMOS system of PMOS 230/NMOS 230 connect directly to WBLT 203 and the CMOS system of PMOS 2010/NMOS 2010 connect directly to WBL 205. PMOS 230, PMOS 240, PMOS 2010 receive voltage from Vdd 230, Vdd 240, and Vdd 2010, respectively. Vss 240 acts a device which grounds voltage, wherein NMOS 240 sends voltage to Vss 240.

Write head circuit 200 contains a negative bit line write assist region that is coupled to the bit line driver during a write operation. WBLT 203 and WLBC 205 receive negative biased voltage, wherein write assist techniques dynamically change the operating characteristics of properties of memory cells (e.g., increasing the word-line voltage above the memory cell voltage and lowering the voltage needed to operate SRAM). The negative bit line write assist subsystem contains eight transistors—NMOS 250, PMOS 270, NMOS 270, PMOS 280, NMOS 280, PMOS 290, NMOS 290, and NMOS 260. Voltage is provided by Vdd 270, Vdd 280, and Vdd 290 into the CMOS systems of PMOS 270/NMOS 270; PMOS 280/NMOS 280; and PMOS 290/NMOS 290, respectively. PMOS 270, PMOS 280, and PMOS 290 receive voltage from Vdd 270, Vdd 280, and Vdd 290, respectively. Voltage is grounded by Vss 270, Vss 280, and Vss 290 for the CMOS systems of PMOS 270/NMOS 270; PMOS 280/NMOS 280; and PMOS 290/NMOS 290, respectively. NMOS 250, NMOS 270, NMOS 280, and NMOS 290 sends voltage to Vss 230, Vss 270, Vss 280, and Vss 290, respectively.

Write head circuit 200 contains a region for clock gating, wherein input 215 is a signal from a clock tree. Clock gating saves power by adding more logic to a circuit to prune the clock tree. Pruning the clock disables tree portions of the circuitry so that the flip-flops (e.g., bi-stable flip-flop 110) within a circuit do not have to switch states. The switching of logic states is a type of switching activity which leads to the leakage of energy and unwanted power consumption. Input 215 sends data through NOT 230, which in turn is sent through NOT 240, and arrives at the gate terminal of NMOS 270. The data retains the original state as received by input 215 as two logical inverter operations are performed after each other by NOT 230 and NOT 240, respectively.

Write head circuit 200 contains a region for decoding repair signals. Input 205 and input 207 are a combination of two bits passed through NAND 210 to yield a bit with a state of logic data 1. This bit is outputted to the node which is directly connected to the terminal of NAND 210. This bit can either: (i) be inverted via the node connected to NOT 210 and output 217; or (ii) pass through the node directly attached to output 219 in order to retain the state of logic data 1.

Write circuit 200 contains a region for selecting: (a) the input of NAND 220 or (b) the input of NAND 230 to be finally propagated to the bit lines of an array core while a write operation is being performed. The selecting region contains two CMOS systems—NMOS 210/PMOS 210 and NMOS 220/PMOS 220. These two CMOS systems complement each other as one CMOS system gates logic data and the other CMOS system passes logic data through the bit lines. In an exemplary embodiment, when the output of NAND 210 has a state of logic data 0, the state of logic data 0 activates the CMOS system of NMOS 210/PMOS 210, to pass the output data of NAND 220 to the to the node which receives this bit. In the same exemplary embodiment, when the output of NAND 210 has a state of logic data 1, the state of logic data 1 activates the CMOS system of NMOS 220/PMOS 220, to pass the output data of NAND 230 to the to the node which receives this bit.

Write circuit 200 contains a region for: (i) buffering data into a circuit; and (ii) implementing a gating mechanism using the write-address of the MSB (i.e., the highest order bit). Inputs 205 and 207; input 209; input 211; input 213; and input 215 are components which can input data into NAND 210, NAND 220, NOT 220, NAND 230, and NOT 230, respectively. The MSB (which has a state of logic data 0 or logic data 1) is sent into input 211, which in turn passes through NOT 220 in order to invert the logic data state of the MSB. The MSB is subsequently an input to NAND 220 or NAND 230. The other input for NAND 220 is input 209, which is a data bit having a state of logic data 0 or logic data 1. The other input for NAND 230 is input 213, which is another data bit having a state of logic data 0 or logic data 1. The output of NAND 220 and NAND 230 (which both apply NAND logic operations on the input) is sent to the CMOS system of NMOS 210/PMOS 210 and the CMOS system of NMOS 220/PMOS 220, respectively. As stated above, these CMOS systems behave as the selecting circuitry. By utilizing the complementary and binary nature of the MSB at input 211, the data bit at input 213, and the data bit at input 209, eight valid bit combinations are possible. The logic state of input 211 either enables gating or does not enable gating, which leads to a state of logic data 1 for enabling gating or a state of logic data 0 for not enabling gating at the outputs of NAND 220 and NAND 230. When gated, WBLT 203 is always set to logic data 1 and WBLC is always set to logic data 0, independent of the data bit at input 209 (or DI_in) or input 213 (or reDIN_N). As a result of this type of gating, there is no switching activity in any bit slice of the array core on which write operations are not being performed. Based on whether there is enabled gating or not enabled gating, one state of logic data is selected over the other state of logic data.

Based on the schematic of write head circuit 200, the NAND devices can be set up as system 300A or system 300B.

Figure 3A:
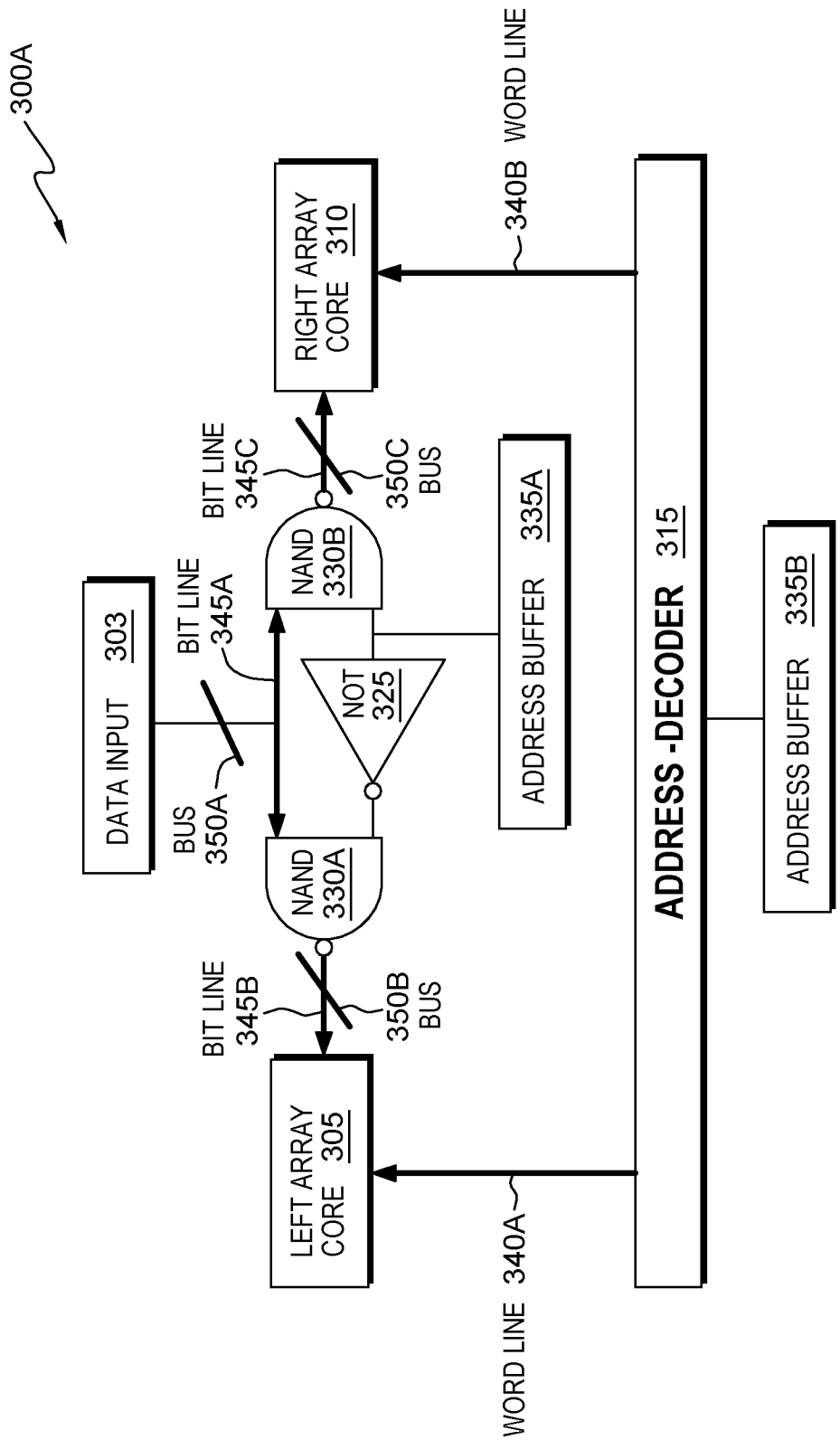
FIG. 3A is a functional block diagram illustrating a first system in a SRAM environment, in accordance with an embodiment of the present invention.

FIG. 3A is a functional block diagram illustrating a first system in a SRAM environment, in accordance with an embodiment of the present invention.

The array in system 300A is divided into two cores—left array core 305 and right array core 310. In an exemplary embodiment, the array includes a total of 256 elements, wherein left array core 305 includes 128 elements and right array core 310 includes 128 elements. These "elements", as used herein, can be used interchangeably with "words". The array is constructed of one or more units of memory cells. The memory cells within left array core 305 and right array core 310 are each organized in terms of columns and rows.

In this embodiment, write line driver 155 performs the actions described below. Write head circuit 200 of FIG. 2 is a schematic of electronic components within write bit line driver 155. In one embodiment, write bit line driver 155 is depicted as containing NAND 330A and NAND 330B for buffering data from a device/source such as data input 303. An input terminal of NAND 330A is connected to an output terminal of NOT 325 while the input terminal of NOT 325 is connected to an input terminal of NAND 330B. Bit line 345A directly connects NAND 330A and NAND 330B to each other. Bit line 345B directly connects NAND 330A to left array core 305. Bit line 345C directly connects NAND 330B to right array core 310. Bus 350A, bus 350B, and bus 350C are multiple bit communication systems which transfer data between data input 303 and an input terminal of NAND 330A and an input terminal of NAND 330B through bit line 345A; NAND 330A and left array core 305 through bit line 345B; and NAND 330B and right array core 310 through bit line 345C, respectively.

Address buffer 335A is a region of physical memory storage used to temporarily store the MSB and transfers the MSB to the input terminal of NOT 325 and an input terminal of NAND 330B. The write data is composed with the MSB of the write-address. In an exemplary embodiment, when left array core 305 is not accessed, then the output of NAND 330A is logic data 1, independent of any switching on the write-data input of NAND 330A.

Address buffer 335B is a region of physical memory storage used to temporarily store address bits 0-7 and transfers the MSB to address-decoder 315 (which is a similar device to address decoder 135). Address bit 0 is the MSB, which is used to enable gating through NAND 330A and NAND 330B. There are 8 bits among address bits 0-7, which leads to 256 words. Write and read operations may be performed on these words. More specifically, write operations are performed on the 256 words, wherein 128 words are transferred to left array core 305 through word line 340A and the other 128 words are transferred to right array core 310 through word line 340B. The address range of the 128 words transferred to left array core 305 is address 0 to 127. The address range of the 128 words transferred to right array core 310 is address 128 to 255.

Figure 3B:
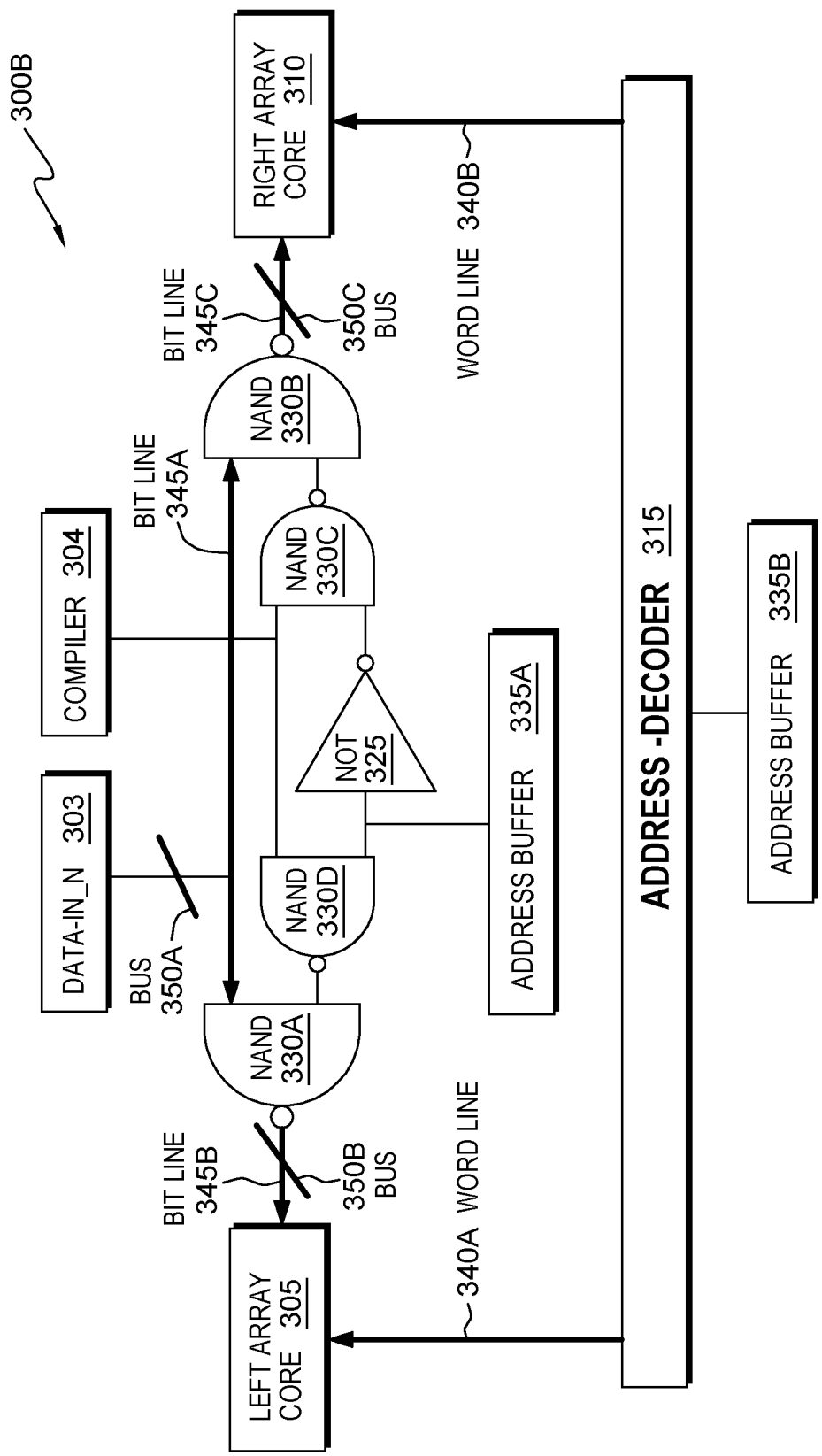
FIG. 3B is functional block diagram illustrating a second system in a SRAM environment, in accordance with an embodiment of the present invention.

FIG. 3B is a functional block diagram illustrating a second system in an SRAM environment, in accordance with an embodiment of the present invention.

For cases where there is a high switching activity on the MSB of the write-address, there is a potential for system 300A to create additional power dissipation even when the write-data is not switching. To account for this, the gating can be disabled by another control-signal and using the structures as arranged in system 300B.

The array in system 300B is divided into two cores—left array core 305 and right array core 310. In an exemplary embodiment, the array has a total of 256 elements, wherein left array core 305 has 128 elements and right array core 310 has 128 elements. These "elements", as used herein, can be used interchangeably with "words". The array is constructed of one or more units of memory cells. The memory cells within left array core 305 and right array core 310 are each organized in terms of columns and rows.

Compiler 304 is a device designed to limit switching activity, especially with respect to the MSB. Switching activity is the measurement of changes of signal values.

Switching activity is dependent on: (i) the probability the signal or the MSB (as in the case of system 300B) has a state of logic data 1; and (ii) and toggle density, which is the number of switches per unit time. Compiler 304, which suppresses switching activity, is connected to an input terminal of NAND 330D and input terminal of NAND 330C, which may promote switching activity.

In this embodiment, write line driver 155 performs the actions described below. Write head circuit 200 of FIG. 2 is a schematic of electronic components within write line driver 155. In one embodiment, write line driver 155 is depicted as containing NAND 330A and NAND 330B for buffering data from a device/source such as data input 303. One of the input terminals of NAND 330D is connected to the input terminal of NOT 325 while the output terminal of NOT 325 is connected to one of the input terminals of NAND 330C. The output of NAND 330D connects to the input of NAND 330A while the output of NAND 330C connects to the input of NAND 330B. Bit line 345A directly connects NAND 330A and NAND 330B to each other through input terminals of NAND 330A and NAND 330B. Bit line 345B directly connects NAND 330A to left array core 305. Bit line 345C directly connects NAND 330B to right array core 310. Bus 350A, bus 350B, and bus 350C are multiple bit communication systems which transfer data between data input 303 and an input terminal of NAND 330A and an input terminal of NAND 330B through bit line 345A; NAND 330A and left array core 305 through bit line 345B; and NAND 330B and right array core 310 through bit line 345C, respectively. Write line driver 155 invokes compiler 304 to limit the switching activity of the MSB.

Address buffer 335A is a region of physical memory storage used to temporarily store the MSB and transfers the MSB to the input terminal of NOT 325 and an input terminal of NAND 330B. The write data is composed with the MSB of the write-address. In an exemplary embodiment, when left array core 305 is not accessed, the output of NAND 330A is logic data 1, independent of any switching on the write-data input of the NAND 330A.

Address buffer 335B is a region of physical memory storage used to temporarily store address bits 0-7 and transfers the MSB to address-decoder 315. Address bit 0 is the MSB, which is used to enable gating through NAND 330A and NAND 330B. There are 8 bits among address bits 0-7, which leads to 256 words. Write and read operations may be performed on these words. Write operations on performed on the words, wherein 128 words are transferred to left array core 305 through word line 340A and the other 128 words are transferred to right array core 310 through word line 340B. The address range of the 128 words transferred to left array core 305 is address 0 to 127. The address range of the 128 words transferred to right array core 310 is address 128 to 255.

Figure 4:
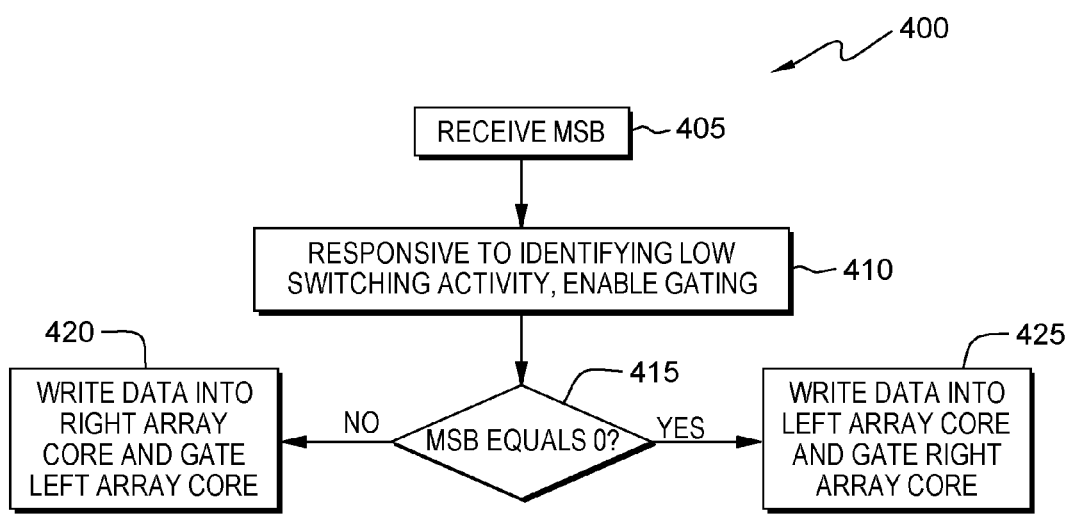
FIG. 4 is a flowchart depicting the operational steps of enabling the gating of an array core during a write operation, in accordance with an embodiment of the present invention.

FIG. 4 is a flowchart 400 depicting the operational steps of enabling the gating of an array core during a write operation, in accordance with an embodiment of the present invention.

In step 405, write line driver 155 receives a MSB. An MSB, as mentioned previously represents the highest order bit (i.e., the bit position in a binary number with the greatest value). In this embodiment, write line driver 155 receives an MSB from address buffer 335A. In other embodiments, write line driver 155 may receive the MSB from one or more other components of systems 300A or 300B.

In step 410, responsive to identifying low switching activity, write line driver 155 enables gating. In this embodiment, write line driver 155 invokes compiler 304 to identify switching activity, based on the switching activity of the MSB. For example, write line driver can invoke compiler 304 to calculate the probability of the MSB of being in the state of logic data 1 and the toggle density and compare the probability to a known threshold configured to measure the switching activity. More specifically, compiler 304 contains sub-components which process configured thresholds and compares identified switching activity with the configured threshold. In instances where compiler 304 determines the threshold associated with high switching activity is not exceeded (i.e., determines there is low switching activity), write line driver 155 enables gating and performs step 410.

In this embodiment, write line driver 155 enables gating off an array core while performing write operations. In other words, write line driver 155 may limit the write-data driven to the gated off array core during a write operation on the array core which is not gated off. In this exemplary embodiment, if the right array core is gated off, then the left array core is not gated off and if the left array core is gated off, then the right array is not gated off.

In instances where compiler 304 determines the threshold associated with high switching activity is exceeded, write line driver 155 does not enable gating while performing write operations. The following logic data is observed:

When gating is not enabled; the MSB is logic data 0; and the inputted data is logic data 0, then the logic data values of the left-WBLT and right-WBLT are logic data 0 and logic data 0, respectively.

When gating is not enabled; the MSB is logic data 0; and the inputted data is logic data 1, then the logic data values of the left-WBLT and right-WBLT are logic data 1 and logic data 1, respectively.

When gating is not enabled; the MSB is logic data 1; and the inputted data is logic data 0, then the logic data values of the left-WBLT and right-WBLT are logic data 0 and logic data 0, respectively.

When gating is not enabled; the MSB is logic data 1; and the inputted data is logic data 1, then the logic data values of the left-WBLT and right-WBLT are logic data 1 and logic data 1, respectively.

In step 415, write line driver 155 determines if the state of the MSB equals logic data 0. The state of the MSB may be equal to logic data 0 or logic data 1. Based on the determination, write line driver 155 determines which array core to gate off. For example, in instances where write line driver 155 determines that the MSB equals 0, then write line driver 155 gates off the right core. Conversely, where when write line driver 155 determines that the MSB equals 1, then write line driver 155 gates off the left core. Accordingly, write operations can be performed on the respective cores that are not gated.

If, in step 415, write line driver 155 determines that the state of the MSB is not logic data 0, then, in step 420, write line driver 155 writes data to the right array core and gates off the left array core. In this embodiment, write line driver 155 gates off the left array core and the left—write bit true line (WBLT, which is similar to WBLT 203) has a state of logic data 1. The following logic data is observed:

When gating is enabled, the MSB is logic data 1; and the inputted data is logic data 0, then the logic data values of the left-WBLT and right-WBLT are logic data 1 and logic data 0, respectively. The left-WBLT is gated off by virtue of the left array core being gated off.

When gating is enabled, the MSB is logic data 1; and the inputted data is logic data 1, then the logic data values of the left-WBLT and right-WBLT are logic data 1 and logic data 1, respectively. The left-WBLT is gated off by virtue of the left array core being gated off.

If, in step 415, write line driver 155 determines that the state of the MSB is logic data 0, then, in step 425, write line driver 155 writes data to the left array core and gates off the right array core. In this embodiment, write line driver 155 gates off the right array core and right—write bit true line (WBLT, which is similar to WBLT 203) has a state of logic data 1. The following logic data is observed:

When gating is enabled; the MSB is logic data 0; and the inputted data is logic data 0, then the logic data values of the left-WBLT and right-WBLT are logic data 0 and logic data 1, respectively. The right-WBLT is gated off by virtue of the right array core being gated off.

When gating is enabled; the MSB is logic data 0; and the inputted data is logic data 1, then the logic data values of the left-WBLT and right-WBLT are logic data 1 and logic data 1, respectively. The right-WBLT is gated off by virtue of the right array core being gated off.

In contrast, circuits, without such a gating mechanism, may consume significantly more power. The gating mechanism assists in limiting switching activity. By using tristate-drivers and setting bit lines to a high Z state, switching activity associated with write bit lines may also be avoided. However, the tristate-drivers require a serial transistor on the p- and n-stack of the inverter that drives the write bit line. This would result in a substantial area-increase for the bit line driver and this hurts the performance of SRAM. The functions of gating and the suppression of switching activity are never performed on the actual memory cell as disclosed by the embodiments of this invention.

FIG. 5 is a table summarizing the power consumed by a non-gated system and gated systems with respect to switching activity, in accordance with an embodiment of the present invention.

In Table 500, the inputted data is a mixture of bits, wherein the ratio of the bits in the state of logic data 0 to the bits in the state of logic data 1 is 1:1. The NAND devices in the gated portion of the write head circuit connect to a 512 word×144 bit array. The power consumed is determined by a computer simulation. The switching factor is measured as percentage of switching states—0%, 50%, and 100% switching activity. The systems which are compared to each other are: (I) the original design in a non-gated circuit; (II) the MSB switching after each cycle in a gated circuit; (III) the MSB switching states every second cycle in a gated circuit; (IV) the MSB switching states every fourth cycle in a gated circuit; (V) the MSB switching states every eighth cycle in a gated circuit; and (VI) the MSB does not switch states in a gated circuited.

The results of Table 500 may be summarized as:

As switching factors increase from 0% switching activity to 50% switching to 100% switching activity, system I consumes 7.70 mA, 47.00 mA, and 85.00 mA, respectively.

As switching factors increase from 0% switching activity to 50% switching to 100% switching activity, system II consumes 48.41 mA, 55.58 mA, and 63.87 mA, respectively.

As switching factors increase from 0% switching activity to 50% switching to 100% switching activity, system III consumes 27.46 mA, 42.07 mA, and 55.88 mA, respectively.

As switching factors increase from 0% switching activity to 50% switching to 100% switching activity, system IV consumes 15.57 mA, 34.02 mA, and 52.47 mA, respectively.

As switching factors increase from 0% switching activity to 50% switching to 100% switching activity, system V consumes 11.46 mA, 31.65 mA, and 51.10 mA, respectively.

As switching factors increase from 0% switching activity to 50% switching to 100% switching activity, system I consumes 7.65 mA, 29.36 mA, and 50.45 mA, respectively.

As the switching factor increases, the power consumed by a system increases. As gated systems (i.e. systems II-VI) engage in switching activity less frequently, the system consumes less power. Most notably, system VI (which is a gated circuit which does not undergo any switching of states) consumes 50.45 mA when the switching factor is 100% in comparison to system I (which is a non-gated circuit) consumes 85.00 mA when the switching factor is 100%. Systems II-VI use circuits as enabled by write line driver 155, wherein these circuits use NAND devices in a configuration as depicted in the schematic in FIG. 2.

What is claimed is:

1. A method for reducing power consumption while operating SRAM, comprises:
    gating off a write bit line of a plurality of write bit lines using a write-head circuit, wherein the write-head circuit comprises:
        a decoder, wherein the decoder decodes the plurality of bits,
        a plurality of write bit lines, wherein each of the plurality of write bit lines corresponds to a respective array core of a plurality of array cores,
        a clock gating region, wherein the clock gating region adds logic data in order to save energy consumption by a SRAM environment, and
        a gating region, wherein the gating region comprises:
            composing write-data into: (i) a first array core of the plurality of array cores or (ii) a second array core of the plurality of array cores,
            utilizing two NAND units which share an inverter unit and a write bit line of the plurality of write bit lines, wherein a first NAND unit of the two NAND units is operatively connected to the first array core of the plurality of array cores and a second NAND unit of the two NAND units is operatively connected to the second array core of the plurality of array cores, and
            utilizing two complimentary metal-oxide semiconductor field-effect transistor (CMOS) units, wherein a first CMOS unit of the two CMOS units is operatively connected to the first NAND unit of the two NAND units and a second CMOS unit of the two CMOS units is operatively connected to the second NAND unit of the two NAND units;
    in response to the SRAM environment receiving the plurality of bits, invoking the decoder to decode the plurality of bits received by the SRAM environment;
    invoking the gating region to receive a first bit from the decoded plurality of bits, wherein the first bit is associated with the plurality of write bit lines;
    invoking the two NAND units and the two CMOS units to:
        (i) gate off a write bit line of the plurality of write bit lines associated with the first bit, or
        (ii) propagate the first bit through the write bit line of the plurality of write bit lines associated with the first bit;
    determining switching activity of the first bit; and
    responsive to determining low switching activity is associated with the first bit, gating off the write bit line of the plurality of write bit lines associated with the first bit.

2. The method of claim 1, wherein receiving the switching activity of the first bit, comprises:

invoking a measurement component to measure the switching activity of the first bit; and responsive to measuring the switching activity of the first bit, comparing the switching activity of the first bit to a threshold, wherein the threshold is an identified amount of switching activity of the first bit.

3. The method of claim 2, further comprising:

responsive to determining the switching activity of the first bit does not exceed the threshold, gating off either a first array core or a second array core of the plurality of array cores.

4. The method of claim 3, further comprising:

determining which of the first or the second array core to gate off by determining a logic data state of the first bit residing in a write bit line, wherein the logic date state is logic data 0 or logic data 1.

5. The method of claim 4, further comprising:

responsive to determining the logic data state of the first bit is logic data 0, composing, write-data into the first array core of the plurality of array cores; and gating off the second array core of the plurality of array cores.

6. The method of claim 4, further comprising:

responsive to determining the logic data state of the first bit is logic data 1, composing, write-data to the second array core of the plurality of array cores; and gating off the first array core of the plurality of array cores.

* * * * *